United States Patent
Briaire

(10) Patent No.: US 10,700,699 B1
(45) Date of Patent: Jun. 30, 2020

(54) VOLTAGE-MODE DAC DRIVER WITH PROGRAMMABLE MODE OUTPUT UNITS

(71) Applicant: Aquantia Corporation, San Jose, CA (US)

(72) Inventor: Joseph Briaire, Mol (BE)

(73) Assignee: Marvell Asia Pte, LTD, Singapore (SG)

(*) Notice: Subject to any disclaimer, the term of this patent is extended or adjusted under 35 U.S.C. 154(b) by 0 days.

(21) Appl. No.: 16/354,542

(22) Filed: Mar. 15, 2019

(51) Int. Cl.
| | |
|---|---|
| H03M 1/80 | (2006.01) |
| H03M 1/68 | (2006.01) |
| H03M 1/06 | (2006.01) |
| H04B 1/403 | (2015.01) |
| H03K 4/00 | (2006.01) |
| H03M 1/66 | (2006.01) |

(52) U.S. Cl.
CPC ......... *H03M 1/808* (2013.01); *H03M 1/0678* (2013.01); *H03M 1/685* (2013.01); *H03K 4/00* (2013.01); *H03M 1/0646* (2013.01); *H03M 1/66* (2013.01); *H03M 1/80* (2013.01); *H04B 1/406* (2013.01)

(58) Field of Classification Search
CPC ........ H03M 1/80; H03M 1/66; H03M 1/0646; H04B 1/406; H03K 4/00
USPC ................. 341/153, 154, 144, 136; 375/216; 327/126; 345/210
See application file for complete search history.

(56) References Cited

U.S. PATENT DOCUMENTS

| | | |
|---|---|---|
| 5,059,978 A | 10/1991 | Valdenaire |
| 6,061,010 A | 5/2000 | Adams et al. |
| 7,675,450 B1 | 3/2010 | Tabatabaei et al. |
| 7,714,759 B1 | 5/2010 | Mu |
| 9,583,241 B1 | 2/2017 | Dempsey |
| 2008/0001801 A1 | 1/2008 | Nhuyen |
| 2010/0052963 A1 | 3/2010 | Soude et al. |
| 2016/0173113 A1* | 6/2016 | Cali ............... H03M 1/0626 341/136 |

* cited by examiner

*Primary Examiner* — Joseph J Lauture

(57) ABSTRACT

A digital-to-analog converter (DAC) includes input circuitry to receive a digital word of N bits, and an array of N bit processing units disposed in parallel. Each of the N bit processing units includes first switch circuitry to generate a first output state based on a first value of a received one of the N bits, and second switch circuitry to generate a second output state based on a second value of the received one of the N bits. The DAC also includes selectively enabled third switch circuitry to generate a conditional third output state.

A voltage-mode driver includes input circuitry to selectively receive one of N bits of a digital word. First switch circuitry generates a first output state based on a first value of the received one of the N bits. Second switch circuitry generates a second output state based on a second value of the received one of the N bits. Selectively enabled third switch circuitry generates a conditional third output state.

16 Claims, 4 Drawing Sheets

VOLTAGE-MODE DAC DRIVER WITH PROGRAMMABLE MODE OUTPUT UNITS

TECHNICAL FIELD

The disclosure herein relates to the field of digital to analog conversion.

BACKGROUND

Digital-to-analog converters (DACs) play a critical role in transforming information from a digital domain into an analog domain. DACs generally convert an abstract finite precision number (such as a fixed-point binary number) into a physical quantity (such as a voltage or current). The number of output levels for a given DAC generally corresponds to its resolution, which is based on the number of "bits" of a given digital code that defines each output level. A variety of DAC architectures exist, including voltage-mode schemes and current steering schemes.

FIG. 1 illustrates a conventional voltage-mode DAC, generally designated 100. The DAC includes a data input 102 that receives a data word of multiple bits during a bit time and a clock input 104 that receives a clock. Respective supply (VDD) and ground (VSS) reference voltages are provided to the DAC, and define two switchable states for the output. Multiple DAC output units include switch circuitry (not shown) that responds to the clock to generate corresponding outputs that are weighted and summed to create an overall output voltage level corresponding to the input word code, but in the analog domain.

FIG. 2 illustrates a conventional two-state output unit grouped with other units to create an array for the DAC architecture of FIG. 1. The output unit includes an output impedance ROUT, and switches SW1 and SW2 to switch either the high or low reference voltage across the impedance to an output node. While the two-state approach provides acceptable linearity characteristics, it is less power-efficient.

One solution to the power-efficiency issue of conventional two-state output units is addressed with conventional tri-state output units, such as shown in FIG. 3. Tri-state output units employ a third intermediate voltage state that may be switched-in to reduce power dissipation. Although less power hungry, the tri-state approach is not as linear as the two-state approach.

What is needed is a flexible method and apparatus to support DAC operations for a voltage-mode DAC driver.

BRIEF DESCRIPTION OF THE DRAWINGS

Embodiments of the disclosure are illustrated by way of example, and not by way of limitation, in the figures of the accompanying drawings and in which like reference numerals refer to similar elements and in which.

DETAILED DESCRIPTION

Embodiments of apparatus and methods for digital-to-analog conversion are disclosed. For one embodiment, a digital-to-analog converter (DAC) includes input circuitry to receive a digital word of N bits, and an array of N bit processing units disposed in parallel. Each of the N bit processing units includes first switch circuitry to generate a first output state based on a first value of a received one of the N bits, and second switch circuitry to generate a second output state based on a second value of the received one of the N bits. The DAC also includes selectively enabled third switch circuitry to generate a conditional third output state.

In a further embodiment, a method of operation in a digital-to-analog converter (DAC) includes receiving a digital word of N bits, and providing an array of N bit processing units disposed in parallel. The N bit processing units to receive the digital word of N bits. Each of the N bit processing units generates a first output state based on a first value of a received one of the N bits; generates a second output state based on a second value of the received one of the N bits; and selectively generates a conditional third output state based on a third value of the received one of the N bits.

In yet another embodiment, a voltage-mode driver includes input circuitry to selectively receive one of N bits of a digital word. First switch circuitry generates a first output state based on a first value of the received one of the N bits. Second switch circuitry generates a second output state based on a second value of the received one of the N bits. Selectively enabled third switch circuitry generates a conditional third output state.

Figure 1:
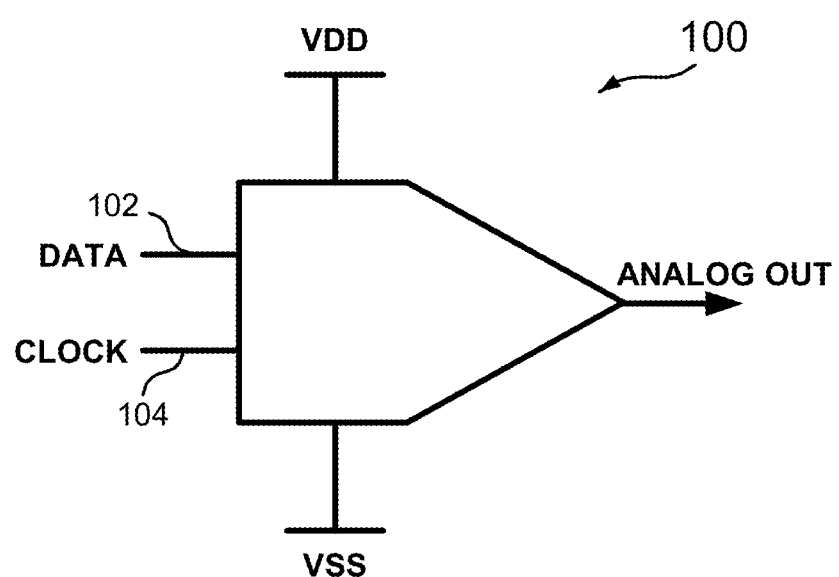
FIG. 1 illustrates a conventional digital-to-analog converter (DAC).
Figure 2:
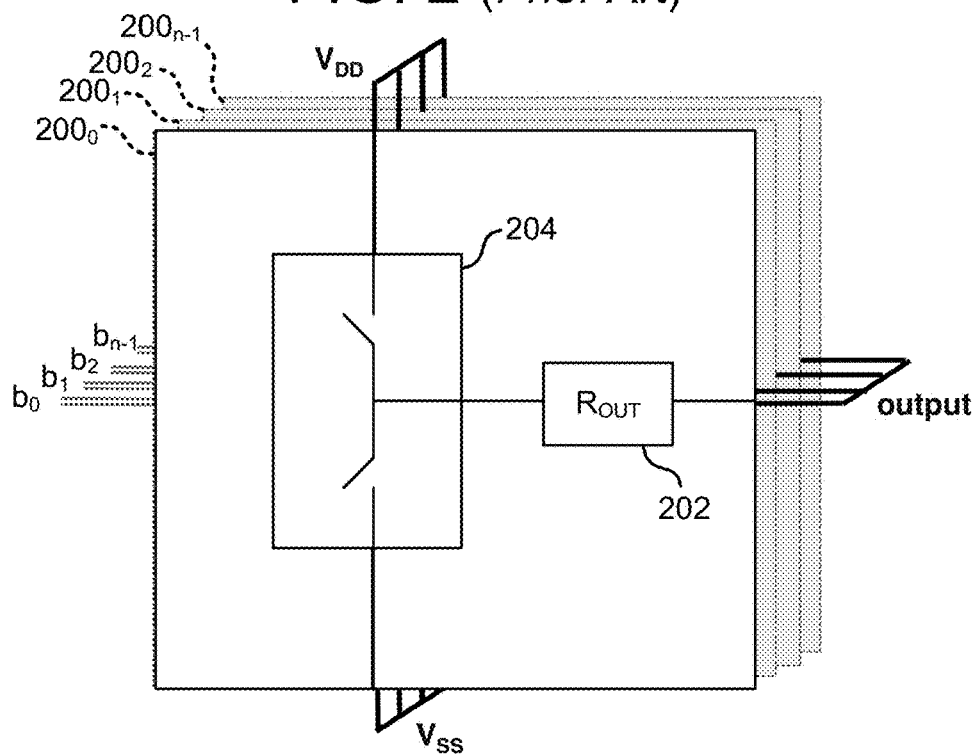
FIG. 2 illustrates further detail of the conventional DAC of FIG. 1.
Figure 3:
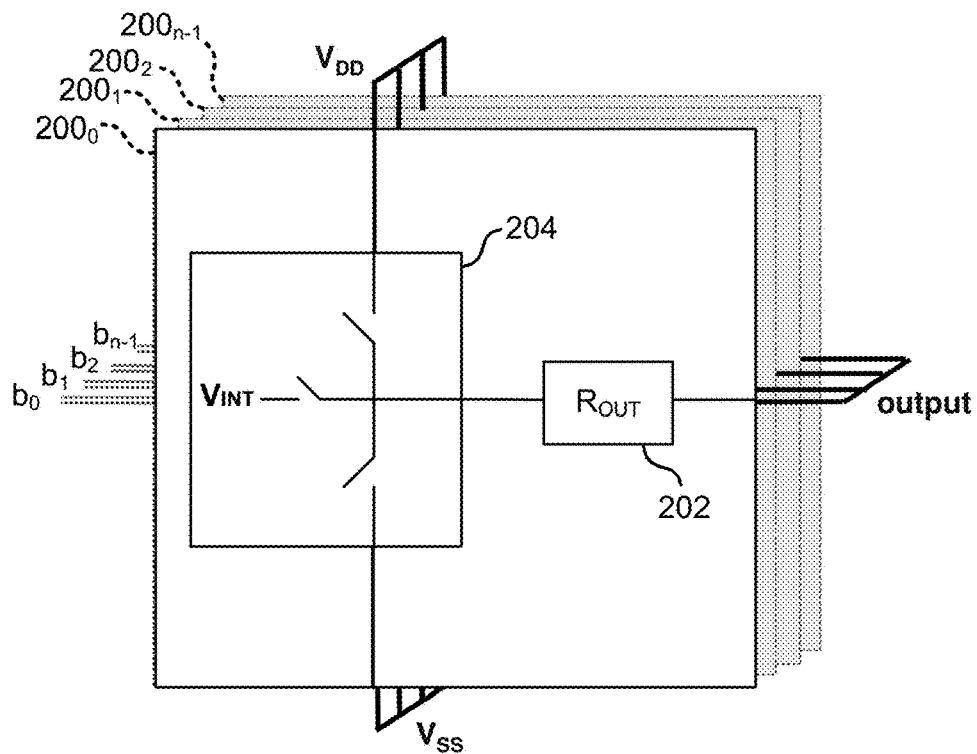
FIG. 3 illustrates further detail of the conventional DAC of FIG. 2.
Figure 4:
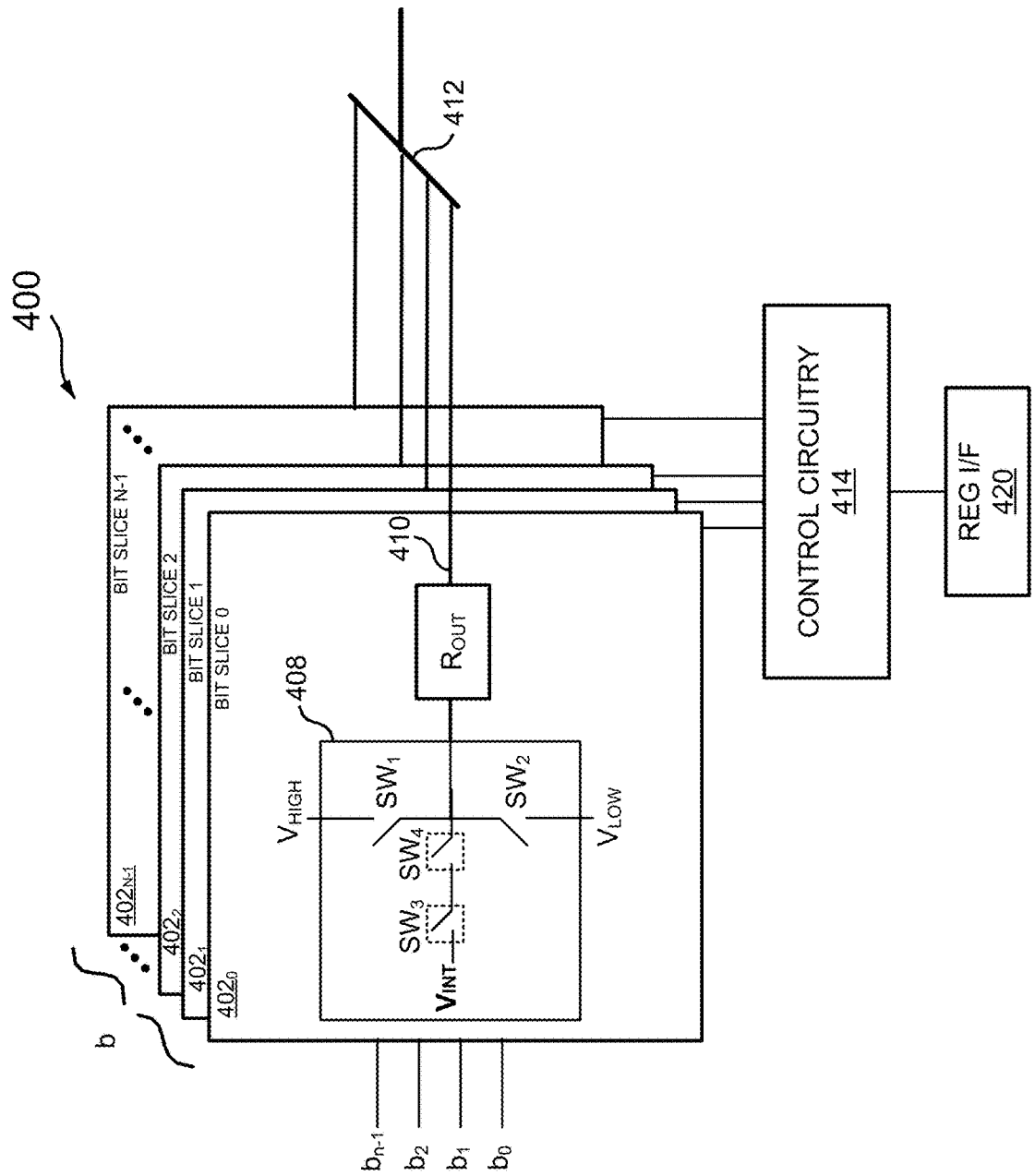
FIG. 4 illustrates one embodiment of an improved DAC architecture.

FIG. 4 illustrates a block diagram of one embodiment of a voltage-mode DAC architecture, generally designated 400, that provides for high-accuracy output impedance tuning. The architecture includes multiple bit processing circuits $402_0$-$402_{n-1}$ that generally correspond to a number "N" of bits $b_0$, $b_1$, $b_2$, $b_{N-1}$, in each received DAC codeword. Each bit processing circuit includes switch circuitry 408 to selectively couple a supply voltage $V_{High}$ ground voltage $V_{LOW}$, or an intermediate voltage $V_{INT}$ (when enabled), to an output node 410 via output impedance $R_{OUT}$. The output impedance selectively couples to an aggregate output node, at 412, based on whether the particular bit processing unit is activated or enabled by control circuitry 414.

For one embodiment, the bit slice circuitry may take the form of the DAC driver circuitry described in copending U.S. patent application Ser. No. 16/354,512, filed Mar. 15, 2019, titled "Hybrid Return-to-Zero Voltage-Mode DAC Driver", assigned to the assignee of the present disclosure and incorporated by reference in its entirety herein.

With continued reference to FIG. 4, in some embodiments, the output impedance $R_{OUT}$ may be a fixed value, such as 16 kohm. Such a value enables aggregating a parallel output impedance of approximately 50 ohms, to match a given line characteristic impedance. For other embodiments, each bit slice output impedance may be a different value, as long as the values relative to each other are known. Aggregating all of the separate output impedances in parallel thus generates an aggregate resulting impedance.

Further referring to FIG. 4, for one embodiment, the switch circuitry 408 for each bit processing unit, or slice, 402 includes first and second switches $SW_1$ and $SW_2$ that are always enabled to provide at least two output states for the DAC. A third switch $SW_3$ is selectively enables (such as by a fourth switch $SW_4$, for example) to selectively generate a third, intermediate output state, based on a programmed configuration mode. This architecture allows a user to configure each bit slice as a dual-state (with −1, 1 levels) or tri-state driver (with −1, 0, 1 levels), depending on the application.

For some embodiments, the DAC architecture 400 includes control circuitry 414 that couples to each bit slice 402. The control circuitry includes storage 420 (such as a mode register) to store a value for each bit processing unit as to whether the unit is to operate as a dual-state or tri-state driver. For one embodiment, each mode value or bit may represent a flag to enable/disable the third switch of the associated bit processing unit, thus enabling/disabling generation of the third output state. The programmability may be carried out during manufacture, or via a port accessible in the field.

Figure 5:
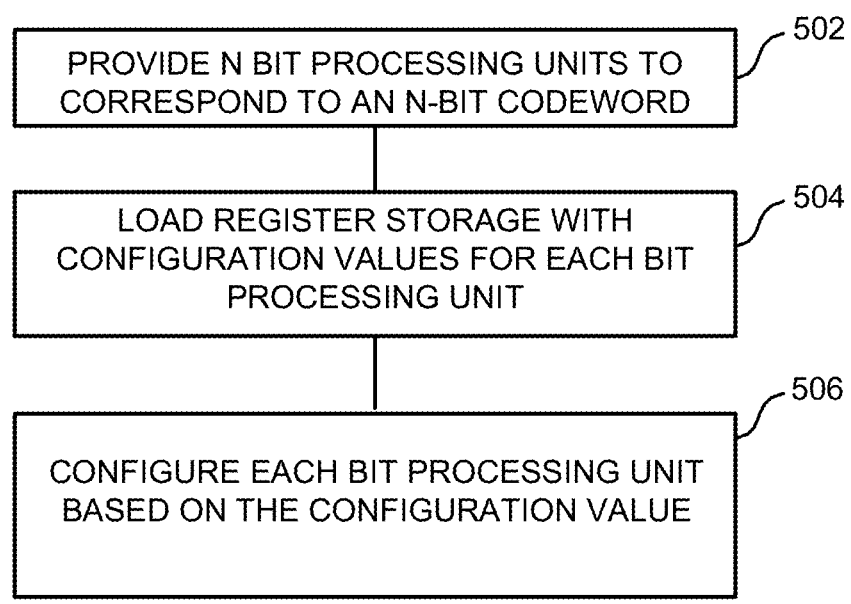
FIG. 5 illustrates a flowchart of steps that may be performed in a method of operating a DAC such as that shown in FIG. 4.

In operation, and referring now to FIG. 5, the DAC architecture of FIG. 4 may be provided in, for example, a high-speed Ethernet physical layer (PHY), to carry out digital-to-analog conversion with a high-level of precision. The DAC thus provides, at 502, N bit processing slices, with each bit processing slice corresponding to an N-bit codeword. At 504, as a step during manufacture, or during an optional field-programming process, the mode register circuitry is loaded with configuration values such that each of the bit processing slices are configured as a dual-state or tri-state driver for processing corresponding bits of the received codeword. During a startup or initialization process, the bit processing units are then configured based upon the corresponding mode register values, at 506. For one embodiment, the mode register value involves a bit to enable/disable the third switch circuitry. In some circumstances, all of the bit slices may be configured as dual-state drivers, or all configured as tri-state drivers. Other examples may involve configuring some of the bit processing slices different than others.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. A digital-to-analog converter (DAC), comprising:
input circuitry to receive a digital word of N bits;
an array of N bit processing units disposed in parallel;
wherein each of the N bit processing units comprises
first switch circuitry to generate a first output state based on a first value of a received one of the N bits;
second switch circuitry to generate a second output state based on a second value of the received one of the N bits; and
selectively enabled third switch circuitry to generate, when enabled, a conditional third output state and to cooperate with the first switch circuitry and the second switch circuitry to define a tri-state DAC configuration, the first switch circuitry and the second switch circuitry forming a dual-state DAC configuration when the selectively enabled third switch circuitry is disabled.

2. The DAC according to claim 1, embodied as a voltage-mode DAC.

3. The DAC according to claim 1, wherein each of the N bit processing units comprises
an output impedance;
respective high, low and intermediate voltage sources;
wherein the first switch circuitry includes a first switch to couple the output impedance to the high voltage source based on the first value of the received one of the N input bits;
wherein the second switch circuitry includes a second switch to couple the output impedance to the low voltage source based on the second value of the received one of the N input bits; and
wherein the third switch circuitry includes a third switch responsive to control circuitry to conditionally couple the output impedance to the intermediate voltage source.

4. The DAC according to claim 3, wherein the control circuitry independently enables/disables the third switch circuitry of each of the N bit processing units.

5. The DAC according to claim 3, wherein the control circuitry includes mode register circuitry to store a mode value for each of the N bit processing units.

6. The DAC according to claim 5, wherein the control circuitry independently enables/disables the third switch circuitry of each of the N bit processing units based on the corresponding mode value.

7. The DAC according to claim 5, wherein each mode value comprises a flag bit, and wherein the third switch circuitry is enabled/disabled based on the flag bit.

8. A method of operation in a digital-to-analog converter (DAC), the method comprising:
receiving a digital word of N bits;
providing an array of N bit processing units disposed in parallel, the N bit processing units to receive the digital word of N bits;
wherein for each of the N bit processing units
generating a first output state with a first switch circuit, the first output state based on a first value of a received one of the N bits;
generating a second output state with a second switch circuit, the second output state based on a second value of the received one of the N bits; and
selectively generating a conditional third output state by crumbling a third switch circuit to cooperate with the first switch circuit and the second switch circuit to form a tri-state DAC configuration, the conditional third output state based on a third value of the received one of the N bits, the first switch circuit and the second switch circuit forming a duel-state DAC configuration when the third switch circuit is disabled.

9. The method according to claim 8, wherein the first, second and third output states are represented by respective first, second and third output voltages.

10. The method according to claim 8, wherein each of the N bit processing units includes an output impedance, and wherein for each of the N bit processing units:
generating the first output state includes switching the output impedance to a high voltage source with first switch circuitry based on a first value of the received one of the N input bits;
generating the second output state includes switching the output impedance to a low voltage source with second switch circuitry based on a second value of the received one of the N input bits; and
selectively generating the conditional third output state includes switching the output impedance to an intermediate voltage source with third switch circuitry.

11. The method according to claim 10, further comprising:
each of the N bit processing units independently enabling/disabling their respective third switch circuitry.

12. The method according to claim 11, further comprising:
storing a mode value for each of the N bit processing units.

13. The method according to claim 12, wherein the independently enabling/disabling the third switch circuitry is based on the corresponding mode value.

14. A voltage-mode driver, comprising:
input circuitry to selectively receive one of N bits of a digital word;
first switch circuitry to generate a first output state based on a first value of the received one of the N bits;
second switch circuitry to generate a second output state based on a second value of the received one of the N bits; and
selectively enabled third switch circuitry to generate, when enabled, a conditional third output state and to cooperate with the first switch circuitry and the second switch circuitry to define a tri-state driver, the first switch circuitry and the second switch circuitry forming a dual-state driver when the selectively enabled third switch circuitry is disabled.

15. The voltage-mode driver of claim 14, wherein:
for a first operating mode, solely the first switch circuitry and the second switch circuitry are enabled to form the dual-state driver.

16. The voltage-mode driver of claim 15, wherein:
for a second operating mode, the first switch circuitry, the second switch circuitry, and the third switch circuitry are enabled to form the tri-state driver.

* * * * *